United States Patent
Braceras et al.

(10) Patent No.: US 8,630,139 B2
(45) Date of Patent: Jan. 14, 2014

(54) DUAL POWER SUPPLY MEMORY ARRAY HAVING A CONTROL CIRCUIT THAT DYNAMICALLY SELECTS A LOWER OF TWO SUPPLY VOLTAGES FOR BITLINE PRE-CHARGE OPERATIONS AND AN ASSOCIATED METHOD

(75) Inventors: George M. Braceras, Essex Junction, VT (US); Kirk D. Peterson, Jericho, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 13/307,245

(22) Filed: Nov. 30, 2011

(65) Prior Publication Data
US 2013/0135944 A1    May 30, 2013

(51) Int. Cl.
*G11C 7/02* (2006.01)
*G11C 11/34* (2006.01)
*G11C 16/06* (2006.01)

(52) U.S. Cl.
USPC ............... 365/203; 365/207; 365/185.25

(58) Field of Classification Search
USPC ............... 365/189.07, 185.25, 207, 203, 154
See application file for complete search history.

(56) References Cited

U.S. PATENT DOCUMENTS

| | | | |
|---|---|---|---|
| 4,899,317 A | 2/1990 | Hoekstra et al. | |
| 4,964,084 A | 10/1990 | Jung et al. | |
| 5,642,314 A | 6/1997 | Yamauchi | |
| 6,178,108 B1 | 1/2001 | Miyatake et al. | |
| 6,236,605 B1 | 5/2001 | Mori et al. | |
| 6,744,689 B2 | 6/2004 | Itou | |
| 7,304,895 B2 | 12/2007 | Joshi et al. | |
| 7,432,758 B2 | 10/2008 | Chou et al. | |
| 7,495,948 B2 | 2/2009 | Suzuki et al. | |
| 7,564,725 B2 | 7/2009 | Houston | |
| 7,570,527 B2 | 8/2009 | Houston | |
| 7,672,182 B2 | 3/2010 | Park et al. | |

(Continued)

FOREIGN PATENT DOCUMENTS

| EP | 0 631 284 A1 | 12/1994 |
|---|---|---|
| JP | 02-172095 A | 7/1990 |
| JP | 2007-242124 A | 9/2007 |

OTHER PUBLICATIONS

GB Application No. GB1220563.9, Combed Search and Examination Report, Dec. 31, 2012, 6 pages.

*Primary Examiner* — Son Dinh
*Assistant Examiner* — Uyen B Tran
(74) *Attorney, Agent, or Firm* — Gibb & Riley, LLC; David A. Cain, Esq.

(57) ABSTRACT

Disclosed is a memory array in which the lower of two supply voltages from two power supplies is dynamically selected for bitline pre-charge operations. In the memory array, a voltage comparator compares the first supply voltage on a first power supply rail to a second supply voltage on a second power supply rail and outputs a voltage difference signal. If the voltage difference signal has a first value indicating that the first supply voltage is equal to or less than the second supply voltage, than a control circuit ensures that the complementary bitlines connected to a memory cell are pre-charged to the first supply voltage. If the voltage difference signal has a second value indicating that the first supply voltage is greater than the second supply voltage, then the control circuit ensures that the complementary bitlines are pre-charged to the second supply voltage. Also disclosed is an associated method.

13 Claims, 6 Drawing Sheets

(56) References Cited

U.S. PATENT DOCUMENTS

| | | |
|---|---|---|
| 7,961,545 B2 | 6/2011 | Yamaoka et al. |
| 2008/0144402 A1 | 6/2008 | Hirabayashi |
| 2009/0046532 A1 | 2/2009 | Gouin |
| 2010/0008171 A1* | 1/2010 | Park et al. ............ 365/203 |
| 2010/0027361 A1* | 2/2010 | Lee et al. ............. 365/203 |
| 2010/0296354 A1* | 11/2010 | Kobayashi ............ 365/203 |
| 2011/0188326 A1 | 8/2011 | Lee et al. |

\* cited by examiner

US 8,630,139 B2

DUAL POWER SUPPLY MEMORY ARRAY HAVING A CONTROL CIRCUIT THAT DYNAMICALLY SELECTS A LOWER OF TWO SUPPLY VOLTAGES FOR BITLINE PRE-CHARGE OPERATIONS AND AN ASSOCIATED METHOD

BACKGROUND

1. Field of the Invention

The embodiments disclosed herein relate to dual power supply memory arrays and, more particularly, to a dual power supply memory array having a control circuit that dynamically selects the lower of two supply voltages for bitline pre-charge operations and an associated method.

2. Description of the Related Art

Those skilled in the art will recognize that size and power scaling are key factors considered in modern integrated circuit design. One common technique for power scaling is to reduce the supply voltage. However, with memory cells, such as static random access memory (SRAM) cells, reducing the supply voltage can increase susceptibility to stability failures (i.e., memory fails). Thus, memory arrays (e.g., SRAM arrays) have been developed that incorporate two power supply rails (i.e., a first power supply rail and a second power supply rail). The first power supply rail can be configured to have a first supply voltage and the second power supply rail can be configured to have a second supply voltage that is greater than the first supply voltage. In this case, the second or higher supply voltage (e.g., a cell supply voltage (Vcs)) of the second power supply rail can be used for memory cell operations, including wordline activation, and the first or lower supply voltage (e.g., a logic supply voltage (Vdd)) of the first power supply rail can be used for all other memory array operations, including bitline pre-charging operations. Using the second or higher supply voltage for memory cell operations avoids stability fails and using the first or lower supply voltage for all other operations allows for reduced power consumption when having a high supply voltage is not critical.

Unfortunately, power supply noise may cause the values of the first and/or second supply voltages to fluctuate such that at times the first supply voltage (Vdd) used for bitline pre-charge operations is in fact greater than the second supply voltage (Vcs) used for memory cell operations. If this occurs, stability fails can occur. Currently-used solutions for avoiding such stability fails include increasing the power to the second power supply rail (Vcs) so that the first supply voltage (Vdd) will never go above it and/or adding decoupling capacitors to the memory array so that power supply noise is minimized; however, such solutions are costly in terms of power and area consumption. Therefore, there is a need in the art for a dual power supply memory array and a method of operating the array that avoids stability fails without resulting in significant power and/or area penalties.

SUMMARY

In view of the foregoing, disclosed herein are embodiments of a dual power supply memory array in which the lower of two supply voltages from two power supplies is dynamically selected for bitline pre-charge operations in order to avoid stability fails without causing significant power and/or area penalities. Specifically, the memory array can incorporate a voltage comparator and a control circuit. The voltage comparator can compare the first supply voltage on a first power supply rail to a second supply voltage on a second power supply rail and can output a voltage difference signal. If the voltage difference signal has a first value indicating that the first supply voltage is equal to or less than the second supply voltage, the control circuit can ensure that the complementary bitlines connected to a memory cell are pre-charged to the first supply voltage. However, if the voltage difference signal has a second value indicating that the first supply voltage is greater than the second supply voltage, the control circuit can ensure that the complementary bitlines are pre-charged to the second supply voltage. Also disclosed herein are associated embodiments of a method for pre-charging complementary bitlines connected to a memory cell of a memory array by dynamically selecting between the lower of two supply voltages.

More particularly, disclosed herein are embodiments of a dual power supply memory array in which the lower of two supply voltages from two power supplies is dynamically selected for bitline pre-charge operations in order to avoid stability fails without causing significant power and/or area penalties.

In each of the embodiments, the dual power supply memory array can comprise a plurality of individually addressable memory cells (e.g., static random access memory (SRAM) cells) arranged in rows and columns. Each memory cell in a given column can be connected to a pair of complementary bitlines. Additionally, each memory cell in a given row can also be connected to a wordline.

In addition, in each of the embodiments, the dual power supply memory array can comprise a first power supply rail, a second power supply rail, a voltage comparator and a control circuit. The first power supply rail can provide a first supply voltage and the second power supply rail can provide a second supply voltage. The voltage comparator can compare the first supply voltage to the second supply voltage and can output a voltage difference signal. This voltage difference signal can have a first value when the first supply voltage on the first power supply rail is equal to or less than the second supply voltage on the second power supply rail and can have a second value when the first supply voltage is greater than the second supply voltage. If the voltage difference signal has the first value, the control circuit can ensure that the complementary bitlines connected to a memory cell are pre-charged to the first supply voltage. However, if the voltage difference signal has the second value, the control circuit can ensure that the complementary bitlines are pre-charged to the second supply voltage.

Specifically, in one embodiment, the control circuit can receive the voltage difference signal and can perform the following based on the value of that voltage difference signal. When the voltage difference signal has the first value, the control circuit can pre-charge the complementary bitlines to the first supply voltage by electrically connecting the complementary bitlines to the first power supply rail. However, when the voltage difference signal has the second value, the control circuit can pre-charge the complementary bitlines to the second supply voltage by electrically connecting the complementary bitlines to the second power supply rail.

In another embodiment, the control circuit can pre-charge the complementary bitlines to the second supply voltage in multiple stages. That is, as in the previously described embodiment, when the voltage difference signal has the first value, the control circuit can pre-charge the complementary bitlines to the first supply voltage by electrically connecting the complementary bitlines to the first power supply rail. However, when the voltage difference signal has the second value, the control circuit can electrically connect the complementary bitlines to the first power supply rail to initiate pre-charging of the complementary bitlines. Then, after a period of time, the control circuit can electrically connect the complementary bitlines to the second power supply rail so as to finish pre-charging the complementary bitlines to the second supply voltage.

Also disclosed herein are embodiments of an associated method for pre-charging complementary bitlines, which are connected to a memory cell of a memory array, to the lower of two supply voltages from two power supplies. Specifically, in each of the method embodiments, a first supply voltage of a first power supply rail is compared (e.g., by a voltage comparator) to a second supply voltage of a second power supply rail and a voltage difference signal is output. This voltage difference signal can have a first value when the first supply voltage is equal to or less than the second supply voltage and can have a second value when the first supply voltage is greater than the second supply voltage.

Then, in each of the method embodiments, the voltage to which the complementary bitlines are pre-charged will depend on the value of the voltage difference signal. For example, in one embodiment, when the voltage difference signal has the first value, the complementary bitlines can be pre-charged to the first supply voltage by electrically connecting the complementary bitlines to the first power supply rail. However, when the voltage difference signal has the second value, the complementary bitlines can be pre-charged to the second supply voltage by electrically connecting the complementary bitlines to the second power supply rail. In another embodiment, pre-charging the complementary bitlines to the second supply voltage can be a two-stage process. That is, like the previously described embodiment, when the voltage difference signal has the first value, the complementary bitlines can be pre-charged to the first supply voltage by electrically connecting the complementary bitlines to the first power supply rail. However, when the voltage difference signal has the second value, the complementary bitlines can be electrically connected to the first power supply rail to initiate pre-charging. Then, after a period of time, the complementary bitlines can be electrically connected to the second power supply rail so as to finish pre-charging the complementary bitlines to the second supply voltage.

BRIEF DESCRIPTION OF THE DRAWINGS

The embodiments herein will be better understood from the following detailed description with reference to the drawings, which are not necessarily drawing to scale and in which.

DETAILED DESCRIPTION

As mentioned above, size and power scaling are key factors considered in modern integrated circuit design. One common technique for power scaling is to reduce the supply voltage. However, with memory cells, such as static random access memory (SRAM) cells, reducing the supply voltage can increase the susceptibility to stability failures (i.e., memory fails). Thus, memory arrays (e.g., SRAM arrays) have been developed that incorporate two power supply rails (i.e., a first power supply rail and a second power supply rail). The first power supply rail can be configured to have a first supply voltage and the second power supply rail can be configured to have a second supply voltage that is greater than the first supply voltage. In this case, the second or higher supply voltage (e.g., a cell supply voltage (Vcs)) of the second power supply rail can be used for memory cell operations, including wordline activation, and the first or lower supply voltage (e.g., a logic supply voltage (Vdd)) can be used for all other memory array operations, including bitline pre-charging operations. Using the second or higher supply voltage for memory cell operations avoids stability fails and using the first or lower supply voltage for all other operations allows for reduced power consumption when having a high supply voltage is not critical.

Unfortunately, power supply noise may cause the values of the first and/or second supply voltages to fluctuate such that at times the first supply voltage (Vdd) used for bitline pre-charge operations is in fact greater than the second supply voltage (Vcs) used for memory cell operations. If this occurs, stability fails can occur. Currently-used solutions for avoiding such stability fails include increasing the power to the second power supply rail (Vcs) so that the first supply voltage (Vdd) will never go above it and/or adding decoupling capacitors to the memory array so that power supply noise is minimized; however, such solutions are costly in terms of power and area consumption.

Figure 1:
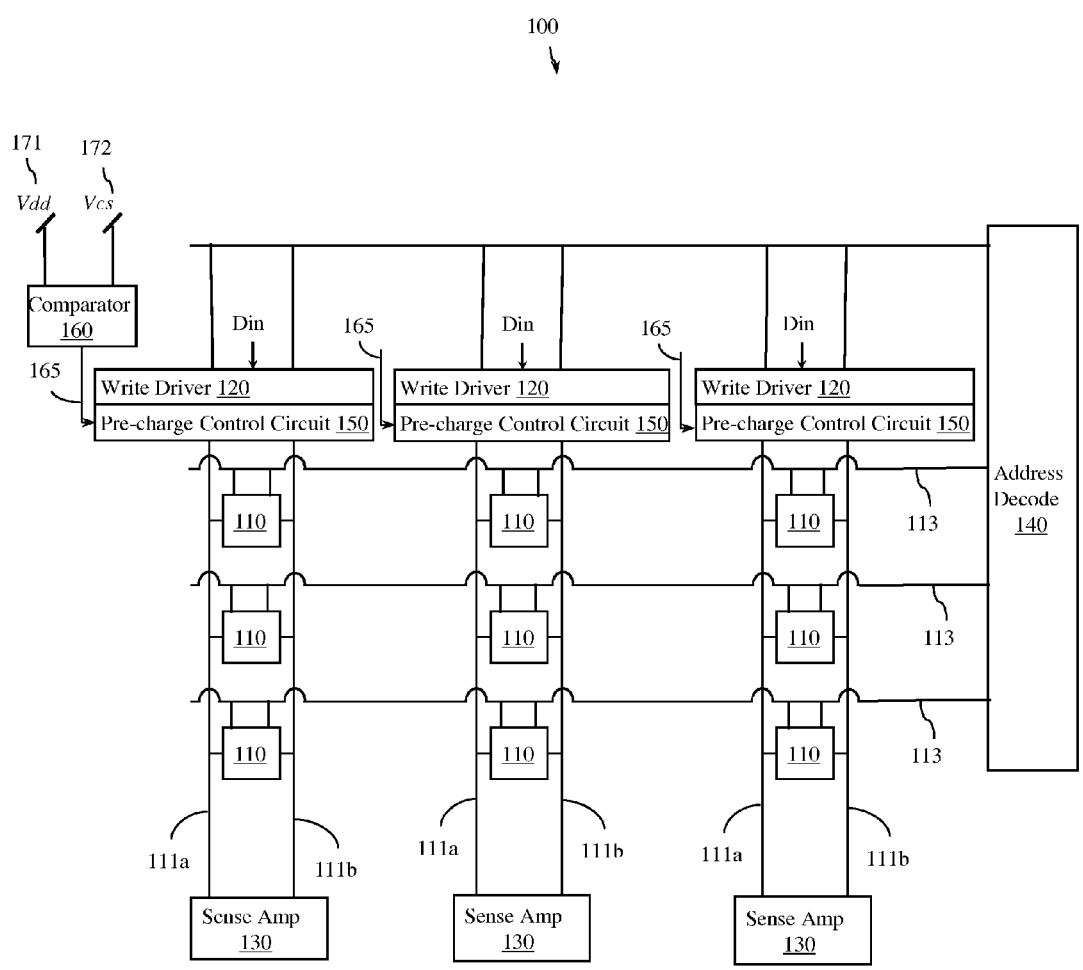
FIG. 1 is a schematic diagram illustrating an embodiment of a dual-power supply memory array.

More particularly, referring to FIG. 1, disclosed herein are embodiments of a dual power supply memory array 100. As with a conventional memory array, the memory array 100 can comprise a plurality of memory cells 110, which are arranged in columns and rows and peripheral circuitry (e.g., an address decode 140, write drivers 120, sense amplifiers 130, etc.) that facilitates writing data values to and reading data values from the memory cells 110.

Figure 2:
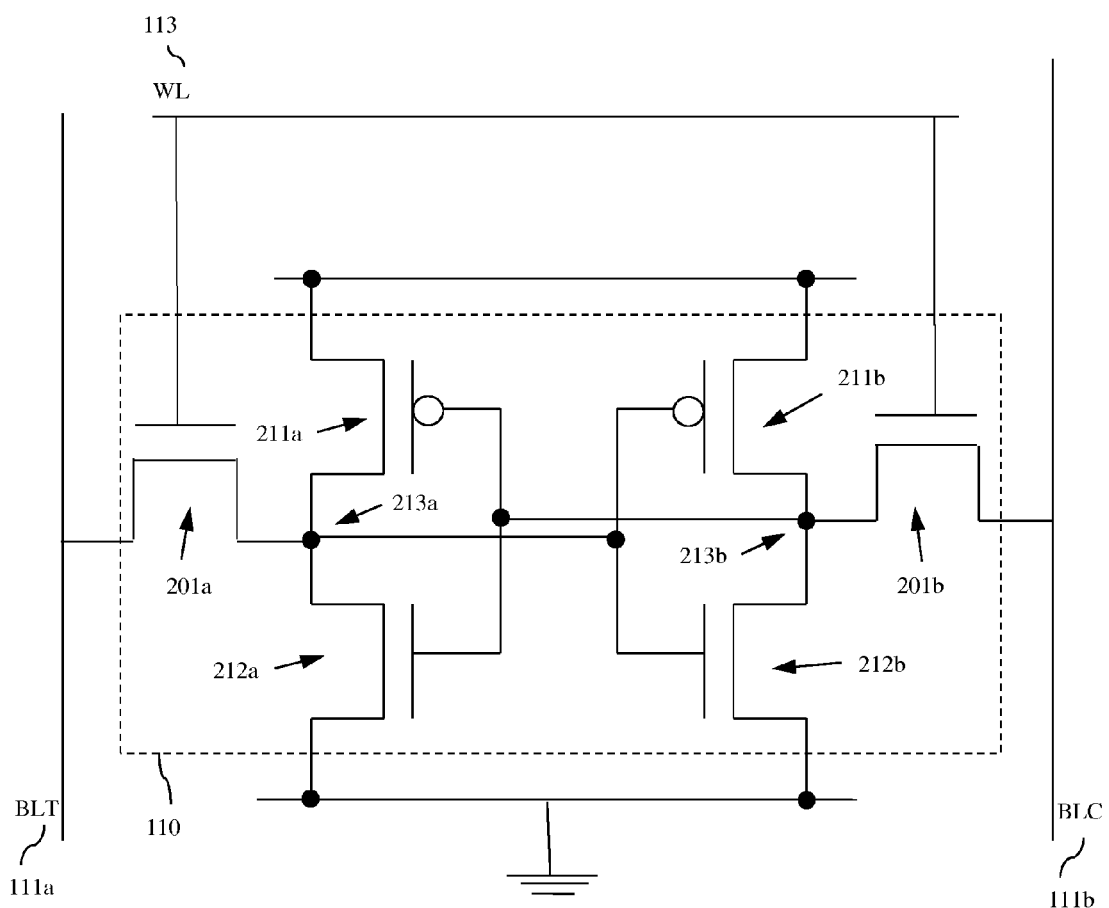
FIG. 2 is a schematic diagram illustrating an exemplary memory cell that can be incorporated into the memory array of FIG. 1.

Referring to FIG. 2 in combination with FIG. 1, each memory cell 110 can, for example, comprise a static random access memory (SRAM) cell, such as a six transistor (6T) SRAM cell. A 6T SRAM cell typically comprises a pair of access transistors (also referred to as pass-gate transistors) 201a, 201b (e.g., N-type field effect transistors) and a pair of cross-coupled inverters. Each inverter can comprise a pull-up transistor 211a, 211b (e.g., a P-type field effect transistor) connected in series to a pull-down transistor 212a, 212b (e.g., an N-type field effect transistor). The drain of one of the access transistors (e.g., access transistor 201a) is connected to a node 213a between the pull-up and pull-down transistors 211a and 212a of one of the inverters and the drain of the other access transistor (e.g., access transistor 201b) is connected to a node 213b between the pull-up and pull-down transistors 211b and 212b, of the other inverter. Furthermore, the source of one of the access transistors (e.g., access transistor 201a) is connected to one bitline of a complementary pair of bitlines (e.g., the bitline 111a, which is also referred to as a true bitline (BLT)) and the source of the other access transistor (e.g., access transistor 201b) is connected to the other bitline in the complementary pair of bitlines (e.g., the bitline 111b, also referred to as the complementary bitline (BLC)). The gates of the access transistors 201a, 201b are connected to a wordline (WL) 113.

Such an SRAM cell 110 operates in three different stages: standby, write and read. In the standby state, the cell is idle. In the write stage, a data value is written into the cell. Specifically, if a data value of "1" (i.e., a high data value) is to be written to the node 213a, a "1" is applied to the bitline 111a and a "0" is applied to the bitline 111b. Then, the wordline 113 is activated to enable the access transistors 201a, 201b and the data value "1" is stored at node 213a. Contrarily, if a data value of "0" (i.e., a low data value) is to be written to the node 213a, a "0" is applied to the bitline 111a and a "1" is applied to the bitline 111b. Then, the wordline 113 is activated to enable the access transistors 201a, 201b and the data value "0" is stored at node 213a. In the reading stage, the data value stored in the cell is read. Specifically, the bitlines 111a, 111b are both pre-charged high (i.e., to a "1") and the wordline 113 is activated to enable the access transistors 201a, 201b. When a data value of "1" is stored on node 213a, bitline 211a will remain charged at its pre-charge level of "1" and the bitline 211b will be discharged to "0" through the transistors 212b and 201b. When a data value of "0" is stored on node 213a, bitline 111a will be discharged to "0" through transistors 212a and 201a and the bitline 111b will remain charged at its pre-charge level of "1". A sense amplifier 130 at the end of each column will sense whether bitline 111a or 111b is higher and, thereby will sense the data value stored in the cell 110.

This description of a 6T SRAM cell and its operation is offered for illustration purposes only and is not intended to be limiting. It should be understood that a 6T SRAM cell with an alternative configuration, another type of SRAM cell (e.g., an eight transistor SRAM cell) or another type of memory cell could alternatively be incorporated into the memory array 100. Furthermore, the above-mentioned peripheral circuitry (e.g., an address decode 140, write drivers 120, sense amplifiers 130, etc.) that can be used to facilitate writing data values to and reading data values from the memory cells 110 is well-known in the art and, thus, the details thereof are omitted from this specification in order to allow the reader to focus on the salient aspects of the embodiments.

Referring again to FIG. 1, the memory array 100 can further comprise two power supply rails (i.e., a first power supply rail 171 and a second power supply rail 172). The first power supply rail 171 can be configured to have a first supply voltage (e.g., a logic supply voltage (Vdd)) and the second power supply rail 172 can be configured to have a second supply voltage (e.g., a cell supply voltage (Vcs)). Generally, the first power supply rail 171 and second power supply rail 172 can be set such that the second supply voltage 172 is sufficiently high to supply power for memory cell operations, including wordline activation, and such that in the absence of noise the first supply voltage, which can be used for other memory array operations, is lower than the second supply voltage in order to save power. In a conventional dual power supply memory array, the power supply rail that is set low (e.g., to Vdd as compared to Vcs) to reduce save power is typically used for all bitline pre-charge operations. However, as a result of power supply noise, the voltages on the power supply rails may actually fluctuate such that Vdd is the higher of the two voltages (i.e., such that Vdd>Vcs) and this relatively higher charge on the bitlines can overwhelm the voltages within the memory cells, thereby resulting in stability fails. Consequently, rather than forcing the bitlines to always be pre-charged to the first supply voltage (e.g., Vdd) on the first power supply rail 171, the memory array 100 is configured so that the lower of the two supply voltages (e.g., Vdd or Vcs) from the two power supply rails 171, 172 is dynamically selected for the bitline pre-charge operations in order to avoid stability fails.

To accomplish this, the memory array 100 can further comprise at least one voltage comparator 160 and a plurality of bitline pre-charge control circuits 150. The voltage comparator 160 can compare (i.e., can be adapted to compare, can be configured to compare, etc.) the voltages on the power supply rails 171, 172. Each pre-charge control circuit 150 can be associated with a corresponding column of memory cells 110 and can pre-charge (i.e., can be adapted to pre-charge, can be configured to pre-charge, etc.) the pair of complementary bitlines 111a, 111b connected to the memory cells 110 in that column.

Figure 3:
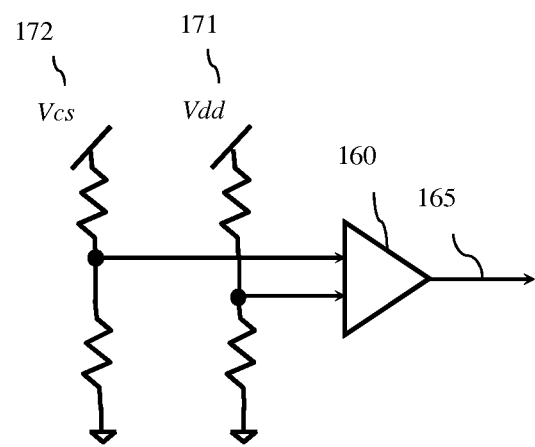
FIG. 3 is a schematic diagram illustrating an exemplary voltage comparator that can be incorporated into the memory array of FIG. 1.

FIG. 3 is a schematic drawing illustrating an exemplary voltage comparator 160. This voltage comparator 160 can comprise an amplifier or any other suitable device that has dual inputs (e.g., one electrically connected to the first power supply rail 171 and the other electrically connected to the second power supply rail 172), that can compare (i.e., that can be adapted to compare, configured to compare, etc.) the first supply voltage on the first power supply rail 171 to the second supply voltage on the second power supply rail 172 and that can output (i.e., that can be adapted to output, configured to output, etc.) a voltage difference signal 165. This voltage difference signal 165 can have a first value (e.g., a value of "0", also referred to as a low value) when the first supply voltage on the first power supply rail 171 is equal to or less than the second supply voltage on the second power supply rail 172 and can have a second value (e.g., a value of "1", also referred to as a high value) when the first supply voltage is greater than the second supply voltage.

Figure 4:
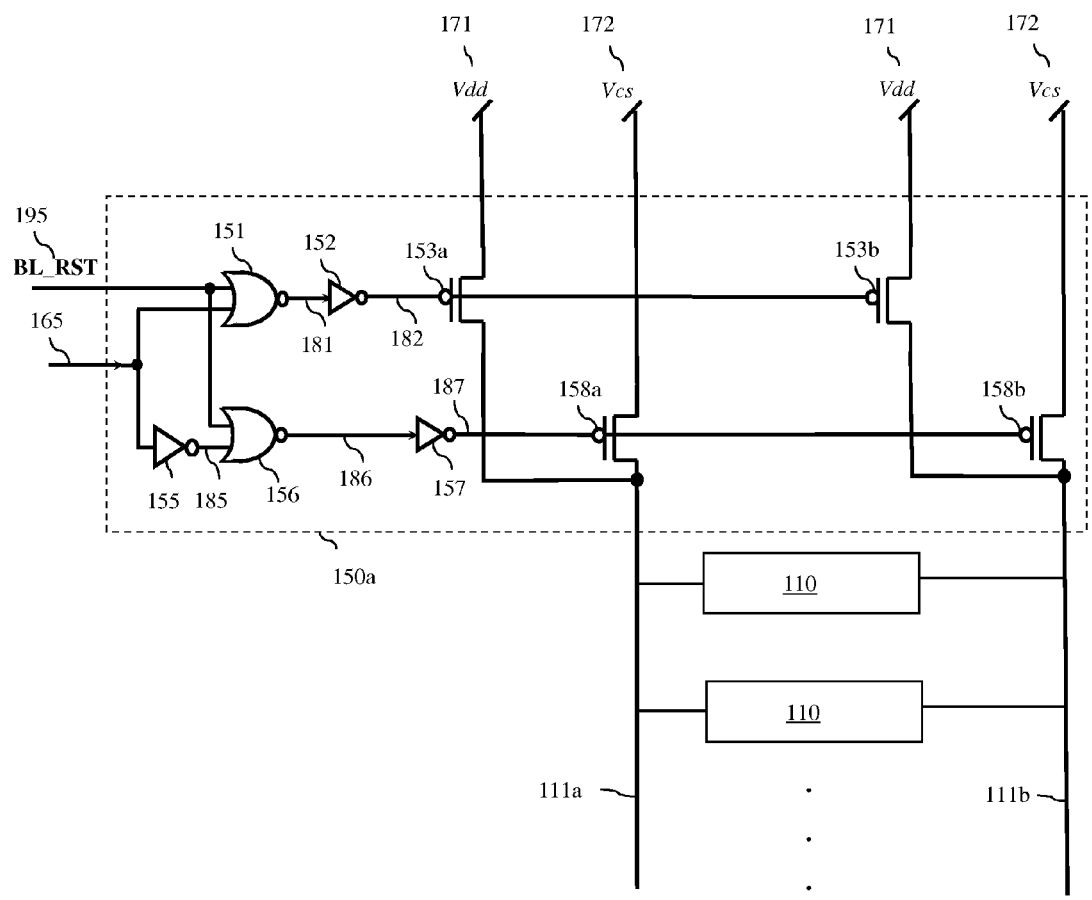
FIG. 4 is a schematic diagram illustrating an exemplary pre-charge control circuit that can be incorporated into the memory array of FIG. 1.
Figure 5:
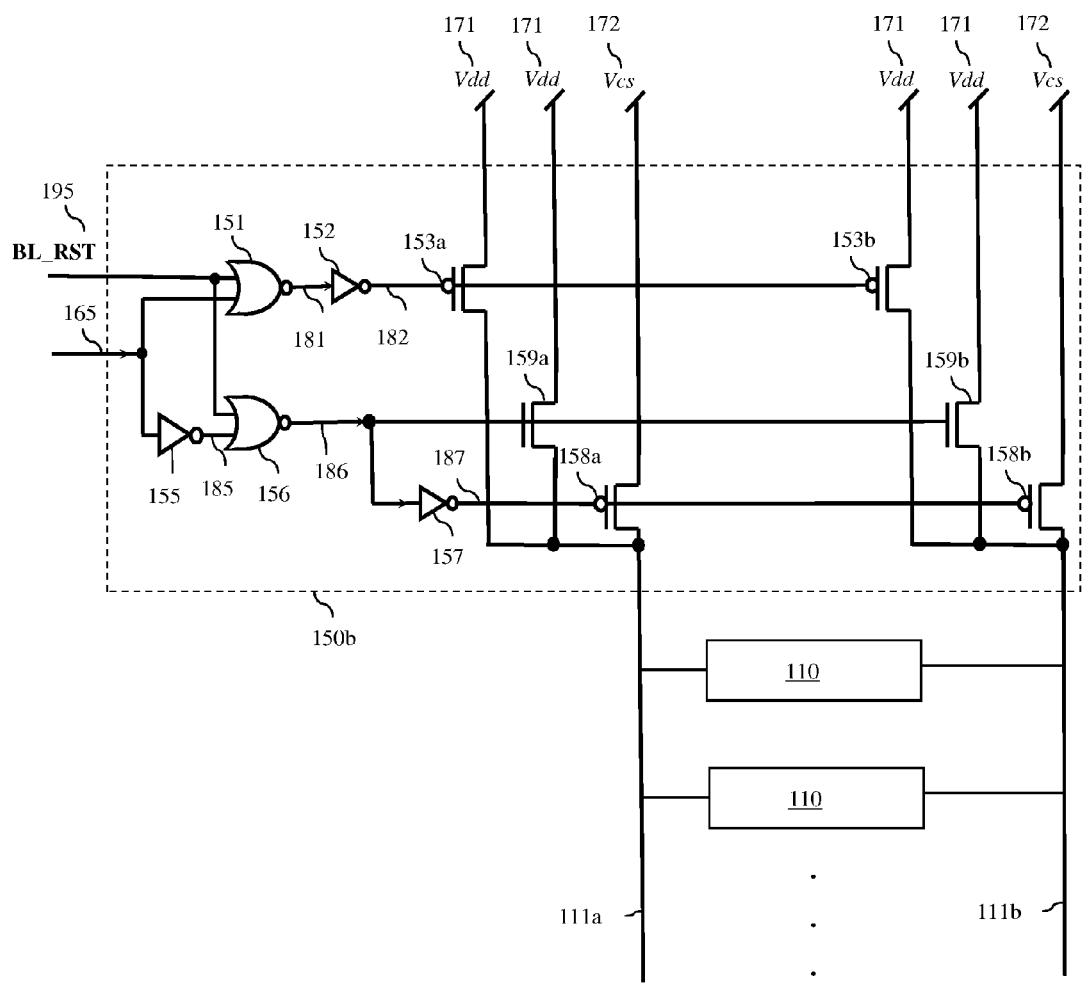
FIG. 5 is a schematic diagram illustrating another exemplary pre-charge control circuit that can be incorporated into the memory array of FIG. 1.

FIGS. 4 and 5 are schematic drawings illustrating exemplary pre-charge control circuits 150a and 150b, respectively, which can be incorporated into the dual power memory array 100 of FIG. 1. Each of these pre-charge control circuits 150a, 150b can receive (i.e., can be adapted to receive, configured to receive, wired to receive, etc.) the voltage difference signal 165 and, based on the value of that voltage difference signal, can pre-charge the bitlines 111a and 111b associated with the corresponding column of memory cells to the first supply voltage (e.g., Vdd) on the first power supply rail 171 or to the second supply voltage (e.g., Vcs) on the second power supply rail 172 prior to a read operation of particular cell 110 in that column. Specifically, if the voltage difference signal 165 has a first value (e.g., a value of "0" or a low value, indicating that the first supply voltage on the first power supply rail 171 is equal to or less than the second supply voltage on the second power supply rail 172), the control circuit 150a, 150b can ensure (i.e., can be adapted to ensure, configured to ensure, etc.) that the complementary bitlines 111a, 111b, which are connected to the memory cell 110 being read, are pre-charged to the first supply voltage (e.g., Vdd). However, if the voltage difference signal 165 has a second value (e.g., a value of "1" or a high value, indicating that the first supply voltage on the first power supply rail 171 is greater than the second supply voltage on the second power supply rail 172), the control circuit 150a, 150b can ensure (i.e., can be adapted to ensure, configured to ensure, etc.) that the complementary bitlines 111a, 111b, which are connected to the memory cell 110 being read, are pre-charged to the second supply voltage (e.g., Vcs).

To accomplish this, the pre-charge control circuit 150a, 150b can comprise at least a first NOR gate 151, an inverter 155, and a second NOR gate 156.

The first NOR gate 151 can receive (i.e., can be adapted to receive, configured to receive, wired to receive, etc.) a bitline restore signal 195 and the voltage difference signal 165. The bitline restore signal 195 can be generated and output by, for example, array timing control circuitry (not shown), and can indicate either that a bitline pre-charge operation should be performed (e.g., when the bitline restore signal 195 has a value of "0" or a low value) or that a bitline pre-charge operation should not be performed (e.g., when the bitline restore signal 195 has a value of "1" or a high value). The first NOR gate 151 can perform the NOR logic and can output a first switch enable signal 181 whose value depends on the values of the bitline restore signal 195 and voltage difference signal 165. For example, if the bitline restore signal 195 and the voltage difference signal 165 both have values of "0" or low values indicating that a bitline pre-charge operation should be performed and that the bitlines 111a, 111b should be pre-charged to the first voltage on the first power supply rail 171, respectively, the first switch enable signal 181 output from the first NOR gate 151 will have a value of "1" (i.e., a high value). Any other combination of bitline restore signal and voltage difference signal values will result in the first switch enable signal 181 having value of "0" (i.e., a low value).

Depending upon its value, the first switch enable signal 181 can result in activation of first switches 153a, 153b to electrically connect the bitlines 111a, 111b to the first power supply rail in order to pre-charge those bitlines 111a, 111b to the first supply voltage (e.g., Vdd). For example, the first switches 153a, 153b can comprise P-type field effect transistors (PFETs) connected in series between the first power supply rail 171 and the bitlines 111a, 111b, respectively. An additional inverter 152 can be connected in series between the first NOR gate 151 and the gates of the PFETs 153a, 153b. This additional inverter 152 can invert (i.e., can be adapted to invert, configured to invert, etc.) the first switch enable signal 182 in order to output an inverted first switch enable signal 182 to control the gates of the PFETs 153a, 153b. For example, if the resulting inverted first enable signal 182 has a value of "0" (i.e., a low value), the PFETs 153a, 153b will be activated and the bitlines 111a, 111b will be electrically connected to the first power supply rail 171. However, if the resulting inverted first enable signal 182 has a value of "1" (i.e., a high value), no such activation of the PFETs 153a, 153b will occur.

Additionally, the inverter 155 can receive and invert (i.e., can be adapted to receive and invert, configured to receive and invert, etc.) the voltage difference signal 165 in order to output an inverted voltage difference signal 185. The second NOR gate 156 can receive (i.e., can be adapted to receive, configured to receive, wired to receive, etc.) both the bitline restore signal 195 and the inverted voltage difference signal 185. The second NOR gate 156 can perform the NOR logic and can output a second switch enable signal 186 whose value depends on the values of the bitline restore signal 195 and inverted voltage difference signal 185. For example, if the bitline restore signal 195 and the inverted voltage difference signal 165 both have values of "0" (i.e., low values) indicating that a bitline pre-charge operation should be performed and that the bitlines 111a, 111b should be pre-charged to the second voltage on the second power supply rail 172, respectively, the second switch enable signal 186 will have a value of "1" (i.e., a high value). Any other combination of bitline restore signal and inverted voltage difference signal values will result in the second switch enable signal 186 having value of "0" (i.e., a low value).

Referring particularly to the pre-charge control circuit 150a of FIG. 4, in one embodiment, second switches 158a, 158b can be activated, depending upon the value of the second switch enable signal 186, in order to electrically connect the bitlines 111a, 111b to the second power supply rail 172 and, thereby pre-charge those bitlines 111a, 111b to the second supply voltage (e.g., Vcs). For example, the second switches 158a, 158b can comprise P-type field effect transistors (PFETs) connected in series between the second power supply rail 172 and the bitlines 111a, 111b, respectively. A second additional inverter 157 can be connected in series between the second NOR gate 156 and the gates of the PFETs 158a, 158b. The second additional inverter 157 can invert (i.e., can be adapted to invert, configured to invert, etc.) the second switch enable signal 186 in order to output an inverted second switch enable signal 187 to control the gates of the PFETs 158a, 158b. For example, if the resulting inverted second enable signal 187 has a value of "0" (i.e., a low value), the PFETs 158a, 158b will be activated and the bitlines 111a, 111b will be electrically connected to the second power supply rail 172. However, if the resulting inverted second enable signal 187 has a value of "1" (i.e., a high value), no such activation of the PFETs 158a, 158b will occur.

It should be noted that in some cases the second power supply 172 may not be robust enough to perform the required pre-charging process from start to finish and, thus, the pre-charging process may need to be performed in multiple stages. Thus, referring particularly to the pre-charge control circuit 150b of FIG. 5, in another embodiment the pre-charging process can be initiated using the first power supply rail 171 and subsequently completed using the second power supply rail 172.

Specifically, as mentioned above, when the second switch enable signal 186 has a value of "1" (i.e., a high value) the bitlines 111a, 111b should be pre-charged to the second voltage of the second power supply rail 172. In the embodiment shown in FIG. 5, when the second switch enable signal 186 has a value of "1", the control circuit 150b does not simply connect the bitlines 111a, 111b to the second power rail 172. Instead, the control circuit 150b can electrically connect (i.e., can be adapted to electrically connect, configured to electrically connect, etc.) the complementary bitlines 111a, 111b to the first power supply rail 171 to initiate the pre-charging process. Then, after a period of time (e.g., a single logic gate delay), the control circuit 150b can electrically connect (i.e., can be adapted to electrically connect, configured to electrically connect, etc.) the complementary bitlines 111a, 111b to the second power supply rail 172 so as to finish pre-charging process.

To accomplish this, the control circuit 150b can further comprise additional switches 159a, 159b. Depending upon its value, the second switch enable signal 186 can result in activation of the additional switches 159a, 159b to electrically connect the bitlines 111a, 111b to the first power supply rail in order to initiate pre-charging of those bitlines 111a, 111b. For example, the additional switches 159a, 159b can comprise N-type field effect transistors (NFETs) connected in series between the first power supply rail 171 and the bitlines 111a, 111b, respectively. The second switch enable signal 186 can control the gates of the NFETs 159a, 159b. For example, if the resulting second enable signal 186 has a value of "1" (i.e., a high value), the NFETs 159a, 159b will be activated and the bitlines 111a, 111b will be electrically connected to the first power supply rail 171. However, if the second enable signal 186 has a value of "0", no such activation of the NFETs 159a, 159b will occur.

Furthermore, in this embodiment, transmission of the second enable signal 186 to the additional switches 159a, 159b can be performed in parallel with transmission of that same second enable signal 186 to a second additional inverter 157.

Specifically, as with the previously described embodiment, a second additional inverter 157 can receive the second switch enable signal 186, can invert that second switch enable signal (e.g., from "1" to "0") and can output an inverted second switch enable signal 187. Activation of the NFETs 159a, 159b by the second enable signal 186 and receipt by the second additional inverter 157 of the second enable signal 186 can occur in the same clock cycle. The inverted second enable signal 187 of "0" can be output one logic-gate delay later to activate the gates of the PFETs 158a, 158b so as to electrically connect the bitlines 111a, 111b to the second power supply rail 172. Thus, activation of the additional switches 159a, 159b allows the pre-charging process to be initiated using the first power supply rail 171 and, then, after a single logic gate delay, activation of the second switches 158a, 158b allows the pre-charging process to be completed using the second power supply rail 172.

Figure 6:
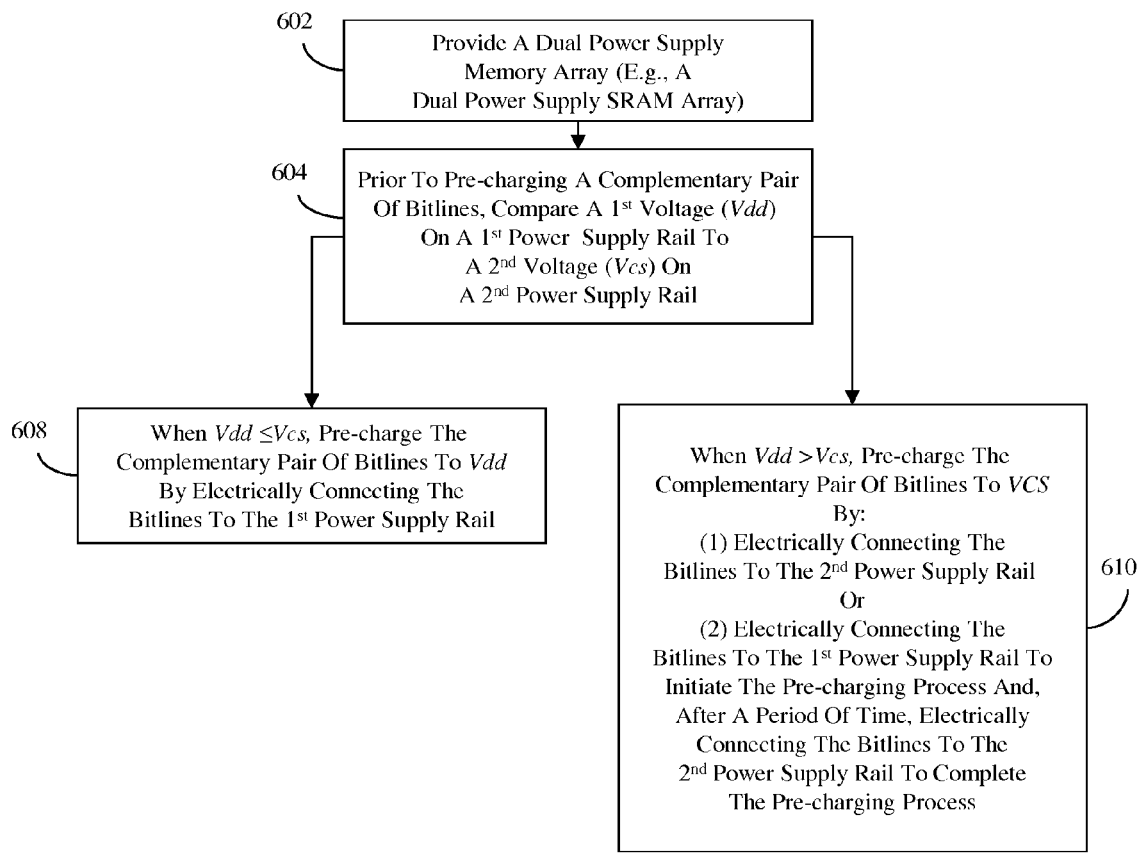
FIG. 6 is a flow diagram illustrating a method embodiment for pre-charging complementary bitlines in the memory array of FIG. 1.

Also disclosed herein are embodiments of an associated method for pre-charging complementary bitlines, which are connected to a memory cell of a memory array, to the lower of two supply voltages from two power supplies. Specifically, referring to FIG. 6 in combination with FIG. 1, the method embodiments can comprise providing a dual power supply memory array, such as the dual power supply memory array 100 described in detail above and illustrated in FIG. 1 (602). In one embodiment of the method, the dual power supply memory array 100 can incorporate pre-charge control circuits such as the pre-charge control circuit 150a described in detail above and illustrated in FIG. 4. In another embodiment of the method, the dual power supply memory array 100 can incorporate pre-charge control circuits such as the pre-charge control circuit 150b described in detail above and illustrated in FIG. 5.

In any case, the method embodiments can comprise, prior to pre-charging a complementary pair of bitlines 111a, 111b, comparing a first supply voltage (e.g., Vdd) of a first power supply rail 171 to a second supply voltage (e.g., Vcs) of a second power supply rail 172 in order to output a voltage difference signal (604). This process 604 can be performed, for example, by a voltage comparator, such as the voltage comparator 160 that outputs a voltage difference signal 165, as described in detail above and illustrated in FIG. 3. This voltage difference signal 165 can have a first value (e.g., a value of "0", also referred to as a low value) when the first supply voltage on the first power supply rail 171 is equal to or less than the second supply voltage on the second power supply rail 172 and can have a second value (e.g., a value of "1", also referred to as a high value) when the first supply voltage is greater than the second supply voltage.

Next, based on the value of that voltage difference signal 165, a complementary pair of bitlines 111a, 111b associated with a corresponding column of memory cells can be pre-charged to either the first supply voltage (e.g., Vdd) on the first power supply rail 171 (608) or to the second supply voltage (e.g., Vcs) on the second power supply rail 172 prior to a read operation of particular cell 110 in that column (610).

Specifically, if the voltage difference signal 165 has a first value (e.g., a value of "0" or a low value, indicating that the first supply voltage on the first power supply rail 171 is equal to or less than the second supply voltage on the second power supply rail 172), the complementary bitlines 111a, 111b connected to the memory cell 110 being read can be pre-charged (e.g., by the control circuit 150a, 150b) to the first supply voltage (e.g., Vdd) (608). This can be accomplished by activating switches 153a, 153b that electrically connect the bitlines 111a, 111b, respectively, to the first power supply rail 171.

If the voltage difference signal 165 has a second value (e.g., a value of "1" or a high value, indicating that the first supply voltage on the first power supply rail 171 is greater than the second supply voltage on the second power supply rail 172), the complementary bitlines 111a, 111b associated with the memory cell 110 being read can be pre-charged (e.g., by the control circuit 150a, 150b) to the second supply voltage (e.g., Vcs) (610). In one embodiment, this can be accomplished by activating switches 158a, 158b to be electrically connected to the complementary bitlines 111a, 111b, respectively, to the second power supply rail 172. However, as discussed in detail above with regard to the structure embodiments, in some cases the second power supply 172 may not be robust enough to perform the required pre-charging process from start to finish and, thus, the pre-charging process may need to be performed in multiple stages. In this case, the pre-charging process can be initiated using the first power supply rail 171 and subsequently completed using the second power supply rail 172. Specifically, switches 159a, 159b can initially be activated in order to electrically connect the complementary bitlines 111a, 111b, respectively, to the first power supply rail 171, thereby initiating the pre-charging process. Then, after a period of time (e.g., a single logic gate delay), switches 158a, 158b can be activated in order to electrically connect the complementary bitlines 111a, 111b to the second power supply rail 172 in order to finish pre-charging process.

The method embodiments, as described above, are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein was chosen for the purpose of describing particular embodiments only and is not intended to be limiting. For example, the singular forms "a", "an" and "the" are intended to include the plural forms as well, unless the context clearly indicates otherwise. Additionally, the terms "comprises", "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. It should further be understood that terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", "immediately adjacent to", etc., mean that at least one element physically contacts another element (without other elements separating the described elements). Finally, it should be noted that corresponding structures, materials, acts, and equivalents of all means or step plus function elements in the claims below are intended to include any structure, material, or act for performing the function in combination with other claimed elements as specifically claimed. The above-descriptions of the various embodiments were presented for purposes of illustration, but were not intended to be exhaustive. Many modifications and variations will be apparent to those of ordinary skill in the art without departing from the scope and spirit of the embodiments.

Therefore, disclosed above embodiments of a dual power supply memory array in which the lower of two supply voltages from two power supplies is dynamically selected for bitline pre-charge operations in order to avoid stability fails without causing significant power and/or area penalities. Specifically, the memory array can incorporate a voltage comparator and a control circuit. The voltage comparator can compare the first supply voltage on a first power supply rail to a second supply voltage on a second power supply rail and can output a voltage difference signal. If the voltage difference signal has a first value indicating that the first supply voltage is equal to or less than the second supply voltage, the control circuit can ensure that the complementary bitlines connected to a memory cell are pre-charged to the first supply voltage. However, if the voltage difference signal has a second value indicating that the first supply voltage is greater than the second supply voltage, the control circuit can ensure that the complementary bitlines are pre-charged to the second supply voltage. Also disclosed herein are associated embodiments of a method for pre-charging complementary bitlines, which are connected to a memory cell of a memory array, by dynamically selecting between the lower of two supply voltages.

What is claimed is:

1. A dual power supply memory array comprising:
    a memory cell;
    a pair of complementary bitlines connected to said memory cell;
    a first power supply rail having a first supply voltage;
    a second power supply rail having a second supply voltage;
    a voltage comparator comparing said first supply voltage to said second supply voltage and outputting a voltage difference signal, said voltage difference signal having a first value when said first supply voltage is any of equal to said second supply voltage and less than said second supply voltage and said voltage difference signal having a second value when said first supply voltage is greater than said second supply voltage; and
    a control circuit performing the following:
        receiving said voltage difference signal;
        when said voltage difference signal has said first value, pre-charging said complementary bitlines to said first supply voltage by electrically connecting said complementary bitlines to said first power supply rail; and
        when said voltage difference signal has said second value, pre-charging said complementary bitlines to said second supply voltage by electrically connecting said complementary bitlines to said second power supply rail.

2. The dual power supply memory array of claim 1, said memory cell comprising a static random access memory (SRAM) cell.

3. The dual power supply memory array of claim 1, further comprising a wordline electrically connected to said memory cell.

4. The dual power supply memory array of claim 1, said first power supply rail and said second power supply rail each being set so that in the absence of noise said first supply voltage is lower than said second supply voltage.

5. The dual power supply memory array of claim 4, said first supply voltage and said second supply voltage fluctuating, due to noise during operation of said memory array, such that at times said first supply voltage is higher than said second supply voltage.

6. The dual power supply memory array of claim 1, said control circuit comprising:
    a first NOR gate receiving a bitline restore signal and said voltage difference signal and outputting a first switch enable signal;
    an inverter receiving said voltage difference signal and outputting an inverted voltage difference signal; and
    a second NOR gate receiving said bitline restore signal and said inverted voltage difference signal and outputting a second switch enable signal.

7. The dual power supply memory array of claim 6, said control circuit comprising:
    said first switch enable signal activating a first switch to electrically connect a bitline to said first power supply rail and pre-charge said bitline to said first supply voltage, only when said bitline restore signal and said voltage difference signal have "0" values; and
    said second switch enable signal activating a second switch to electrically connect said bitline to said second power supply rail and pre-charge said bitline to said second supply voltage, only when said bitline restore signal and said inverted voltage difference signal have "0" values.

8. A method for pre-charging complementary bitlines connected to a memory cell of a memory array, said method comprising:
    comparing a first supply voltage of a first power supply rail to a second supply voltage of a second power supply rail and outputting a voltage difference signal, said voltage difference signal having a first value when said first supply voltage is any of equal to said second supply voltage and less than said second supply voltage and said voltage difference signal having a second value when said first supply voltage is greater than said second supply voltage;
    when said voltage difference signal has said first value, pre-charging said complementary bitlines to said first supply voltage by electrically connecting said complementary bitlines to said first power supply rail; and
    when said voltage difference signal has said second value, pre-charging said complementary bitlines to said second supply voltage by electrically connecting said complementary bitlines to said second power supply rail.

9. The method of claim 8, said memory cell comprising a static random access memory (SRAM) cell.

10. The method of claim 8, said memory array further comprising a wordline electrically connected to said memory cell.

11. The method of claim 8, said first power supply rail and said second power supply rail each being set so that in the absence of noise said first supply voltage is lower than said second supply voltage.

12. The method of claim 11, said first supply voltage and said second supply voltage fluctuating, due to noise during operation of said memory array, such that at times said first supply voltage is higher than said second supply voltage.

13. The method of claim 8,
    when said bitline restore signal and said voltage difference signal are low, activating a first switch with a first switch enable signal to electrically connect a bitline to said first power supply rail and pre-charge said bitline to said first supply voltage, and when said bitline restore signal and an inverted voltage difference signal are low, activating a second switch with a second switch enable signal to electrically connect said bitline to said second power supply rail and pre-charge said bitline to said second supply voltage.

* * * * *